(12) United States Patent
Butendeich et al.

(10) Patent No.: US 9,029,177 B2
(45) Date of Patent: May 12, 2015

(54) OPTOELECTRONIC SEMICONDUCTOR CHIP AND METHOD FOR FABRICATION THEREOF

(75) Inventors: Rainer Butendeich, Regensburg (DE); Alexander Walter, Laaber (DE); Matthias Peter, Regensburg (DE); Tobias Meyer, Ihrlerstein (DE); Tetsuya Taki, Yokohama (JP); Hubert Maiwald, Neutraubling (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 219 days.

(21) Appl. No.: 13/516,676

(22) PCT Filed: Dec. 23, 2010

(86) PCT No.: PCT/EP2010/070658
§ 371 (c)(1),
(2), (4) Date: Sep. 11, 2012

(87) PCT Pub. No.: WO2011/080219
PCT Pub. Date: Jul. 7, 2011

(65) Prior Publication Data
US 2012/0319126 A1  Dec. 20, 2012

(30) Foreign Application Priority Data

Dec. 30, 2009 (DE) .......... 10 2009 060 750

(51) Int. Cl.
*H01L 33/32* (2010.01)
*H01L 33/02* (2010.01)
*H01L 33/24* (2010.01)

(52) U.S. Cl.
CPC ............... *H01L 33/02* (2013.01); *H01L 33/24* (2013.01); *H01L 2924/0002* (2013.01)

(58) Field of Classification Search
CPC ... H01L 21/02631; H01L 33/22; H01L 33/24; C30B 25/02
USPC .................. 257/13, 103, 76, 94, 98, E33.028, 257/E33.023; 438/46, 43
See application file for complete search history.

(56) References Cited

U.S. PATENT DOCUMENTS 5,684,309 A   11/1997  McIntosh et al.
5,831,277 A   11/1998  Razeghi
(Continued)

FOREIGN PATENT DOCUMENTS

CN       1832213 A     9/2006
JP    2000232238 A     8/2000
(Continued)

OTHER PUBLICATIONS

Hangleiter, A., et al., "Suppression of Nonradiative Recombination by V-Shaped Pits in GaInN/GaN Quantum Wells Produces a Large Increase in the Light Emission Efficiency," Physical Review Letters, vol. 95, No. 12, Sep. 16, 2005, pp. 127402-1-127402-4.
(Continued)

*Primary Examiner* — Kenneth Parker
*Assistant Examiner* — Bo Fan
(74) *Attorney, Agent, or Firm* — Slater & Matsil, L.L.P.

(57) ABSTRACT

An optoelectronic semiconductor chip has a first semiconductor layer sequence which comprises a multiplicity of microdiodes, and a second semiconductor layer sequence which comprises an active region The first semiconductor layer sequence and the second semiconductor layer sequence are based on a nitride compound semiconductor material, the first semiconductor layer sequence is before the first semiconductor layer sequence in the direction of growth, and the microdiodes form an ESD protection for the active region.

11 Claims, 7 Drawing Sheets

(56) References Cited

U.S. PATENT DOCUMENTS

| | | | |
|---|---|---|---|
| 6,172,382 B1 | 1/2001 | Nagahama et al. | |
| 6,329,667 B1 | 12/2001 | Ota et al. | |
| 6,693,303 B2 | 2/2004 | Ota et al. | |
| 7,001,791 B2 * | 2/2006 | Kryliouk et al. | 438/46 |
| 7,364,805 B2 | 4/2008 | Morita et al. | |
| 7,446,345 B2 | 11/2008 | Emerson et al. | |
| 7,535,031 B2 | 5/2009 | Kim et al. | |
| 2007/0122994 A1 | 5/2007 | Sonobe et al. | |
| 2008/0297644 A1 | 12/2008 | Farchtchian et al. | |
| 2009/0014713 A1 * | 1/2009 | Kang et al. | 257/13 |

FOREIGN PATENT DOCUMENTS

| | | |
|---|---|---|
| JP | 2002270514 A | 9/2002 |
| JP | 2002368269 A | 12/2002 |
| JP | 200781416 A | 3/2007 |
| JP | 2007150076 A | 6/2007 |
| JP | 200871773 A | 3/2008 |
| KR | 10-0674708 B1 | 1/2007 |
| TW | 569470 B | 1/2004 |
| WO | WO 01/39282 A2 | 5/2001 |
| WO | WO 2006/118623 A1 | 11/2006 |

OTHER PUBLICATIONS

Lee, C.-L., et al., "Using Planarized p-GaN Layer to Reduce Electrostatic Discharged Damage in Nitride-Based Light-Emitting Diode," Japanese Journal of Applied Physics, vol. 46, No. 19, 2007, pp. L457-L460.

Park, E-H., et al., "InGaN-light emitting diode with high density truncated hexagonal pyramid shaped p-GaN hillocks on the emission surface," Applied Physics Letters, vol. 89, No. 25, Dec. 19, 2006, pp. 251106-1-251106.

Takahashi, H., et al., "Effect of Intentionally Formed 'V-Defects' on the Emission Efficiency of GaInN Single Quantum Well," Japanese Journal of Applied Physics, vol. 39, Part 2, No. 6B, Jun. 15, 2000, pp. L569-L571.

* cited by examiner

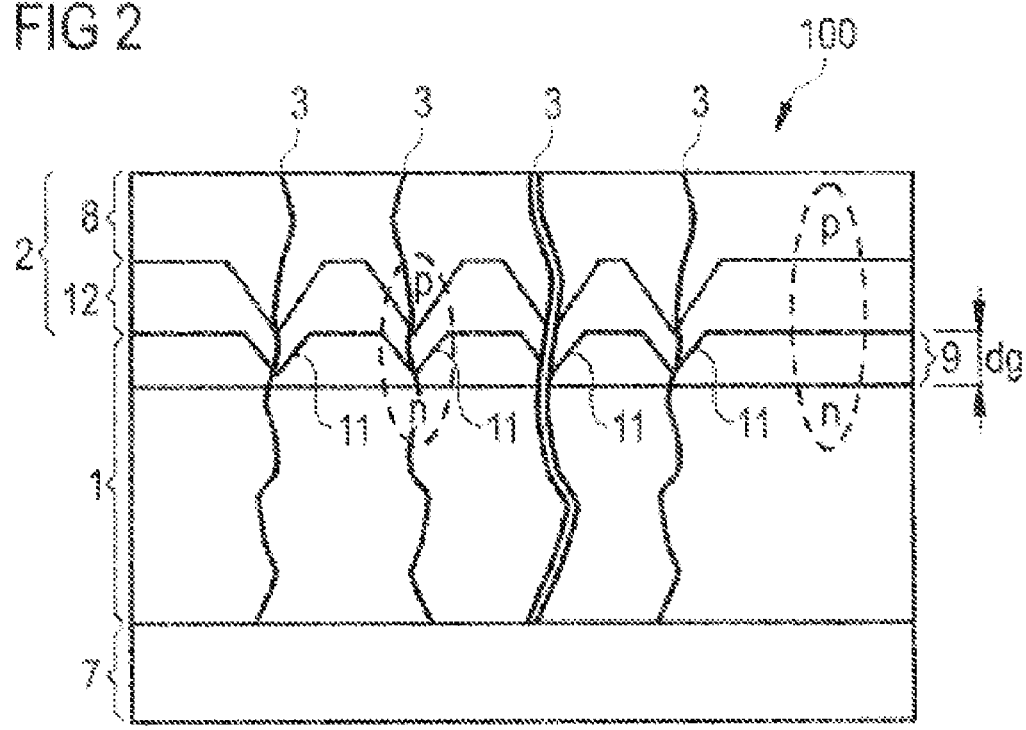

OPTOELECTRONIC SEMICONDUCTOR CHIP AND METHOD FOR FABRICATION THEREOF

This patent application is a national phase filing under section 371 of PCT/EP2010/070658, filed Dec. 23, 2010 (WO 2011/080291, published Jul. 7, 2011), which claims the priority of German patent application DE 10 2009 060 750.1, filed Dec. 30, 2009, each of which is incorporated herein by reference in its entirety.

TECHNICAL FIELD

The present invention relates generally to optoelectronic semiconductor chip and method for fabrication thereof.

SUMMARY

An optoelectronic semiconductor chip is provided.

In one aspect, an optoelectronic semiconductor chip is particularly stable against electrostatic discharges, so-called ESD voltage pulses. Another aspect provides a method for the fabrication of such an optoelectronic semiconductor chip.

The optoelectronic semiconductor chip is a radiation-receiving or radiation-emitting optoelectronic semiconductor chip. For example, the optoelectronic semiconductor chip is a light-emitting diode chip, which emits green and/or blue light during operation.

According to at least one embodiment of the optoelectronic semiconductor chip, the optoelectronic semiconductor chip has a first semiconductor layer sequence, which comprises a multiplicity of microdiodes. A semiconductor layer sequence is in this case intended to mean a sequence of semiconductor layers. In the extreme case, the semiconductor layer sequence may comprise a single semiconductor layer. A semiconductor layer is, in particular, characterized in that the material composition inside the layer does not vary or varies only slightly and/or in that the region which forms the layer fulfills a particular function in the semiconductor chip. A semiconductor layer may in this case comprise a multiplicity of monolayers of a semiconductor material.

The microdiodes are pn junctions in the semiconductor layer sequence, which have a current/voltage characteristic typical of semiconductor diodes. During operation of the optoelectronic semiconductor chip, no radiative recombination of charge carriers preferably takes place in the region of the microdiodes. This means that the microdiodes are not provided for generating electromagnetic radiation, or at least not for generating electromagnetic radiation in the visible range.

The microdiodes have a breakdown voltage in their reverse direction. The microdiodes are in this case preferably formed so that they are not destroyed when the breakdown voltage is exceeded—at least in a particular range of the current strength of the current flowing through the microdiodes.

The microdiodes furthermore have a threshold voltage in the forward direction, above which a current can flow through the microdiodes.

The fact that the first semiconductor layer sequence comprises the microdiodes means in this case that at least a part of the microdiodes is arranged in the first semiconductor layer sequence. For example, the n-side or the p-side of the microdiodes may respectively be arranged in the first semiconductor layer sequence. The remaining part of the microdiodes may be arranged in another layer or layer sequence.

According to at least one embodiment of the optoelectronic semiconductor chip, the optoelectronic semiconductor chip comprises a second semiconductor layer sequence, which comprises an active region. The active region is in this case provided for generating or detecting electromagnetic radiation during operation of the optoelectronic semiconductor chip. This means that, for example, radiative recombination of charge carriers takes place in the active region, during which visible light can be generated. To this end, the active region comprises for example at least one multiple quantum well structure.

The term quantum well structure does not in this case imply any meaning in terms of the dimensionality of the quantization. It therefore includes inter alia quantum wells per se, quantum wires and quantum dots and any combination of these structures. Examples of multiple quantum well structures are described in documents WO 01/39282, U.S. Pat. No. 5,831,277, U.S. Pat. No. 6,172,382 B1 and U.S. Pat. No. 5,684,309, the disclosure content of which is hereby incorporated by reference.

The active region is in this case arranged in the second semiconductor layer sequence when at least a part of the active region, for example the n-side or the p-side, is arranged in the semiconductor layer sequence. For example, the multiple quantum well structure is arranged entirely in the second semiconductor layer sequence.

According to at least one embodiment of the optoelectronic semiconductor chip, the first semiconductor layer sequence and the second semiconductor layer sequence are based on a nitride compound semiconductor material.

In the present context, based on nitride compound semiconductor material means that the semiconductor layer sequences, or at least a part thereof, comprise a nitride compound semiconductor material, preferably $Al_nGa_mIn_{1-n-m}N$, or consist thereof, where $0 \leq n \leq 1$, $0 \leq m \leq 1$ and $n+m \leq 1$. This material need not necessarily comprise a mathematically exact composition according to the formula above. Rather, it may for example comprise one or more dopants as well as additional components. For the sake of simplicity, however, the formula above involves only the essential components of the crystal lattice (Al, Ga, In, N), even though these may be replaced and/or supplemented with small amounts of other substances.

For example, the first semiconductor layer sequence and the second semiconductor layer sequence are based on an InGaN and/or a GaN semiconductor material.

According to at least one embodiment of the optoelectronic semiconductor chip, the first semiconductor layer sequence is placed in front of the second semiconductor layer sequence in a growth direction. This means that during fabrication of the optoelectronic semiconductor chip, the first semiconductor layer sequence is grown first and the second semiconductor layer sequence is grown subsequently. The second semiconductor layer sequence may in this case be arranged directly on the first semiconductor layer sequence. This proves particularly advantageous in the case of semiconductor chips which form light-emitting diodes that emit green light. Particularly in the case of light-emitting diodes that emit blue light, it is possible for an intermediate layer to be arranged between the first and second semiconductor layer sequences.

According to at least one embodiment of the optoelectronic semiconductor chip, the microdiodes form ESD protection for the active region of the optoelectronic semiconductor chip. This means that, in the event of an ESD voltage pulse, the microdiodes are adapted to dissipate an electrical current. The charge imparted by the ESD voltage pulse thus flows through at least some of the microdiodes and not or only slightly through the active region, so that no damage to the active region takes place. The optoelectronic semiconductor chip thereby has an ESD strength of at least 1 kV. For example, an ESD strength of at least 1 kV, typically about 2 kV, is achieved.

According to at least one embodiment of the optoelectronic semiconductor chip, a majority of the microdiodes have electrical properties of the same type. This means that at least 50% of the microdiodes, in particular at least 75%, and in the extreme case 90% or more of the microdiodes have electrical properties of the same type. For example, one electrical property which characterizes the microdiodes is the breakdown behavior of the microdiodes. In particular, it is then possible for the microdiodes to have a breakdown behavior of the same type. This means that the breakdown voltage in the reverse direction of the microdiodes is essentially equal for a majority of the microdiodes. For example, the breakdown voltage of at least 50%, in particular at least 75%, and in the extreme case 90% or more of the microdiodes lies in a range of ±25%, in particular ±10%, around an average value of the breakdown voltage of the microdiodes. In this way, it is possible for a majority of the microdiodes to open simultaneously in the event of an ESD voltage pulse in the reverse direction. The ESD voltage pulse then does not flow away merely through a few leakage paths, but is distributed over the ensemble of microdiodes and therefore, in the ideal case, over the entire cross-sectional area of the optoelectronic semiconductor chip. In this way, a particularly high ESD strength of the optoelectronic semiconductor chip is achieved.

In other words, the microdiodes do not increase the electrical resistance along a possible breakdown path in the optoelectronic semiconductor chip, but instead an ESD voltage pulse can be dissipated over a large area by a multiplicity of microdiodes of the same type, so that only a small current, which does not lead to local destruction of the optoelectronic semiconductor chip, flows through each microdiode.

According to at least one embodiment of the optoelectronic semiconductor chip, the optoelectronic semiconductor chip has a first semiconductor layer sequence, which comprises a multiplicity of microdiodes. The optoelectronic semiconductor chip furthermore has a second semiconductor layer sequence, which comprises an active region. The first and second semiconductor layer sequences are in this case arranged on one another in the growth direction and are each based on a nitride compound semiconductor material. The microdiodes in this case form ESD protection for the active region and therefore increase the ESD strength of the optoelectronic semiconductor chip.

According to at least one embodiment of the optoelectronic semiconductor chip, at least one of the microdiodes is formed by a V-pit. For example, all the microdiodes of the optoelectronic semiconductor chip are respectively formed by a V-pit. In the nitride compound semiconductor material, the V-pit has for example the shape of an open pyramid inverted in the growth direction, which has for example a hexagonal base face. In cross section, this pit has the shape of a V. In the nitride compound semiconductor material—for example in a layer which is based on GaN or consists of this semiconductor material—a V-pit may, for example, be generated by adjusting the growth parameters, in particular the growth temperature. The size of the V-pit then depends on the thickness of the layer in which it is generated.

V-pits are formed for example in the region of threading dislocations, which are formed for example during the heteroepitaxy of the semiconductor material onto a growth substrate, which has a different lattice constant to the semiconductor material. For example, the nitride compound semiconductor material is in this case grown onto a growth substrate made of sapphire, with respect to which the nitride compound semiconductor material has a lattice mismatch of about 14%. Threading dislocations are however also observed in the case of homoepitaxy, and therefore the semiconductor layer sequences may for example also be deposited onto a growth substrate which is based on GaN or consists of GaN.

In particular, it is possible for a majority of the V-pits to have similar dimensions. This means that at least 50%, in particular at least 75%, or in the extreme case 90% or more of the V-pits have similar dimensions. V-pits in this case have similar dimensions when, for example, the base area of the V-pits in a plane perpendicular to the growth direction varies by at most ±25%, in particular by at most ±10%, around an average value of the base area of the V-pits in this plane. This means that a majority of the V-pits are then distinguished by an equal or similar base area. V-pits having similar dimensions form microdiodes which have electrical properties of the same type. This means that microdiodes having electrical properties of the same type, in particular having a breakdown behavior of the same type, are formed by V-pits having similar dimensions.

The V-pits are, for example, arranged entirely in the first semiconductor layer sequence.

According to at least one embodiment of the optoelectronic semiconductor chip, at least one of the microdiodes comprises a pn junction. For example, all the microdiodes comprise a pn junction. Furthermore, the active region also comprises at least one pn junction. For example, the active region comprises a multiple quantum well structure, which can be described as a pn junction. This means that both the microdiodes and the active region can be described as semiconductor diodes having a current/voltage characteristic typical of semiconductor diodes. The pn junction of the microdiode and the pn junction of the active region are in this case biased in the same direction.

According to at least one embodiment of the optoelectronic semiconductor chip, the pn junction of the microdiode has a lower breakdown voltage in the reverse direction than the pn junction of the active region. In this case, the breakdown behavior of the microdiodes is preferably formed to be of the same type.

This can also be achieved in that the microdiodes are respectively formed by a V-pit.

In the event of an ESD voltage pulse in the reverse direction, preferably some, for example at least 50% and in particular at least 75%, and in the extreme case at least 90% or all of the microdiodes then open simultaneously. The charge imparted by the ESD voltage pulse therefore does not flow merely through one or a few leakage paths having a low breakdown voltage, but is distributed over the ensemble of leakage paths constituted by the microdiodes. Therefore, a critical current density which leads to destruction of the optoelectronic semiconductor chip does not occur in any of the current paths through which the charge flows away. In the ideal case, a quasi two-dimensional breakdown therefore takes place over the entire cross-sectional area of the optoelectronic semiconductor chip. As a result of this, an ESD voltage pulse does not cause any damage. In this way, for example, an ESD strength of at least 1 kV can be achieved.

According to at least one embodiment of the optoelectronic semiconductor chip, the pn junction of the microdiode has a higher threshold voltage in the forward direction than the pn junction of the active region. This means that during regular operation of the optoelectronic semiconductor chip, when the pn junctions of the microdiodes and of the active region thus receive current in the forward direction, the current flows through the active region while the microdiodes are still not conducting. The microdiodes therefore do not interfere, for example, with radiation generation in the active region. This means that the microdiodes cannot influence the forward characteristic of the optoelectronic semiconductor chip or can influence it only slightly. This can also be achieved by using the above-described V-pits for forming the microdiodes.

According to at least one embodiment of the optoelectronic semiconductor chip, the density of the microdiodes in the optoelectronic semiconductor chip is at least $5\times10^7$ per $cm^2$. For example, the density of the microdiodes is at least $10^8$ per $cm^2$. This may, for example, be achieved by an appropriate growth temperature at which the ESD layer, in which the microdiodes are arranged, is grown. The density indicated refers to the case of epitaxy on a sapphire substrate. In the case of smaller lattice mismatches between the growth substrate and the material of the semiconductor layer sequences, lower densities are possible and prove expedient for increasing the ESD strength.

According to at least one embodiment of the optoelectronic semiconductor chip, at least 75% of the microdiodes are arranged inside an ESD layer. In this case, it is sufficient for the p-sides or the n-sides of the microdiodes to be arranged in the ESD layer. It is possible for all the microdiodes to be arranged in the ESD layer. This means that all the V-pits are then arranged in the ESD layer.

The thickness of the ESD layer is preferably at least half the thickness of the active region in the growth direction, and is preferably at most three times the thickness of the active region in the growth direction. For example, the ESD layer has a thickness of at least 80 nm and at most 150 nm.

The thickness of the ESD layer in this case also dictates the size of the individual microdiodes, when these are formed as V-pits. For example, the thickness of the ESD layer is proportional to the base area (i.e. for example the base area of the hexagonal pyramid which forms the pit) of a V-pit in an ESD layer. Such a large thickness of the ESD layer, and the associated size of the microdiodes, ensures a sufficient ESD strength of the microdiodes. For example all the microdiodes, that is to say for example all the V-pits, are arranged inside the ESD layer.

According to at least one embodiment of the optoelectronic semiconductor chip, an ESD voltage pulse, which is applied in the reverse direction on the optoelectronic semiconductor chip, flows away through at least 50% of the microdiodes in the reverse direction of the microdiodes. This means that a majority of the microdiodes—at least 50%—have such a similar breakdown voltage that the ESD pulse flows away through them. In this way, it becomes possible for a voltage pulse to flow away virtually over the entire cross-sectional area of the optoelectronic semiconductor chip, so that the current density in the individual microdiodes is not high enough that damage to the semiconductor material can take place. It is, however, sufficient for the ESD pulse to flow away through a few microdiodes. A certain ESD strength of the semiconductor chip is thereby already achieved.

According to at least one embodiment of the optoelectronic semiconductor chip, at least 75% of the microdiodes are respectively arranged in the region of a threading dislocation in the semiconductor material of the optoelectronic semiconductor chip. This is achieved, for example, by forming the microdiodes as V-pits. The V-pits are preferentially formed on threading dislocations. For this reason, it is also possible to adjust the density of the microdiodes by means of the density of the threading dislocations in the semiconductor material.

A method for the fabrication of an optoelectronic semiconductor chip is furthermore provided. Preferably, an optoelectronic semiconductor chip as described here can be fabricated by the method. This means that the features described for the method are also disclosed for the semiconductor chip, and vice versa.

The method comprises, for example, a number of steps as described here.

First, a growth substrate is provided.

In a subsequent method step, a first semiconductor layer sequence and a second semiconductor layer sequence, which follows on from the first semiconductor layer sequence, may be deposited epitaxially. In this case, the first semiconductor layer sequence comprises an ESD layer which is deposited at a growth temperature at which V-pits occur in a high density in the ESD layer.

Usually, attempts are made to avoid the occurrence of V-pits during epitaxy. In the present case, however, in order to produce the microdiodes the ESD layer is grown at low growth temperatures in order to generate V-pits in a sufficient density. The actual temperature range which is suitable for generation of the V-pits depends in this case on the growth system used. It can be determined by growing an ESD layer at different temperatures, and selecting a temperature range in which the density of the V-pits is sufficient or particularly high.

In the present case, a temperature range of below 900° C., in particular at least 790° C. and at most 870° C., at which the ESD layer is deposited, is selected. This temperature range has proven suitable for the formation of V-pits which, in the ESD layer, form microdiodes through which an ESD voltage pulse can be dissipated. The second semiconductor layer sequence in this case preferably comprises an active region which is adapted for radiation detection or radiation generation.

The ESD layer is grown in particular at a growth temperature of at most 900° C., in particular by using a triethylgallium precursor with the carrier gas nitrogen ($N_2$). This growth mode has been found to be particularly advantageous for the generation of V-pits having similar dimensions and therefore for the production of microdiodes having electrical properties of the same type, in particular having a breakdown behavior of the same type. In contrast to conventional growth conditions for, e.g., n-doped layers of GaN, in which the layers are grown using a trimethylgallium precursor with the carrier gas hydrogen ($H_2$), under these growth conditions geometrically very similar V-pits are formed in a high density. In other words, the growth in the lateral direction, transversely to the growth direction, is restricted. In this way, V-pits are formed particularly on dislocation lines in a clearly defined ESD layer.

According to at least one embodiment of the method, the material of the growth substrate has a lattice mismatch with respect to the material of the semiconductor layer sequences to be grown. For example, sapphire is selected as the growth substrate and the subsequent semiconductor layer sequences are based on a nitride compound semiconductor material. In this case, V-pits are formed in a particularly high density. The method, however, even proves advantageous in homoepitaxy, although the density of the V-pits may be reduced in this case.

According to at least one embodiment, the ESD layer is based on GaN. This means that the ESD layer may for example consist of GaN—except for minor impurities or doping.

BRIEF DESCRIPTION OF THE DRAWINGS

The optoelectronic semiconductor chip described here and the method described here will be explained in more detail below with the aid of exemplary embodiments and the associated figures.

FIGS. 2, 3A, 3B, 3C, 4A, 4B, 4C, 5, 6 and 7A, 7B, 7C are used to explain in more detail exemplary embodiments of optoelectronic semiconductor chips described here and of methods described here.

Elements which are the same or of the same type, or which have the same effect, are provided with the same references in the figures. The figures and the size proportions of the elements represented in the figures with respect to one another are not to be regarded as true to scale. Rather, individual elements may be represented with exaggerated size for better representation and/or for better comprehension.

DETAILED DESCRIPTION OF ILLUSTRATIVE EMBODIMENTS

Figure 1A:
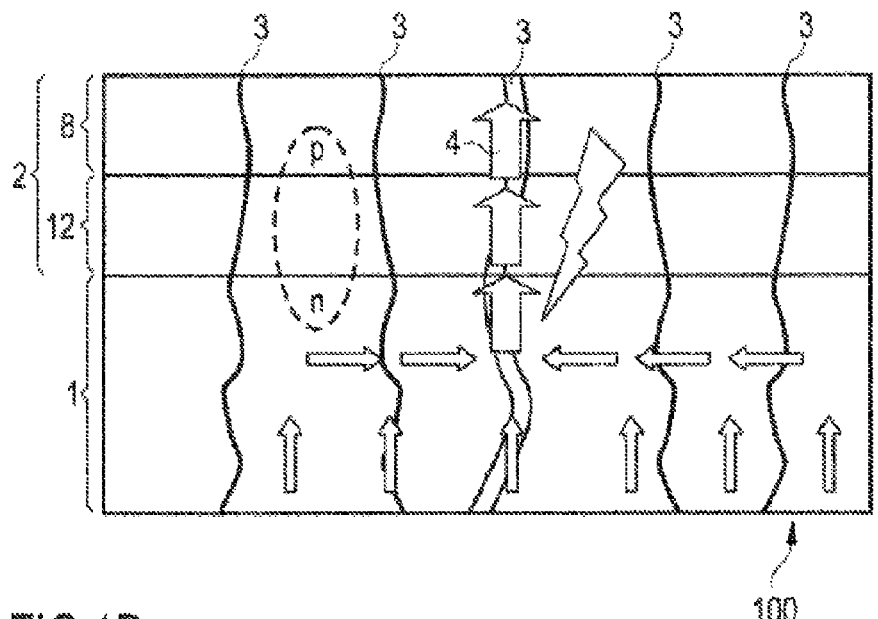
FIGS. 1A, 1B and 1C are used to explain in more detail the problem on which the optoelectronic semiconductor chip described here is based.

FIG. 1A shows a conventional optoelectronic semiconductor chip in a schematic sectional representation. The optoelectronic semiconductor chip comprises, for example, a first semiconductor layer sequence 1 and a second semiconductor layer sequence 2. The first semiconductor layer sequence 1 may be an n-doped region which, for example, is based on a nitride compound semiconductor material. The second semiconductor layer sequence 2 follows on from the first semiconductor layer sequence 1 in a growth direction and, for example, is likewise based on a nitride compound semiconductor material. The second semiconductor layer sequence 2 comprises an active region 12. The active region 12 comprises, for example, at least one multiple quantum well structure, which is intended for the generation of electromagnetic radiation during operation of the optoelectronic semiconductor chip. The second semiconductor layer sequence 2 may furthermore comprise a p-doped region 8. A pn junction is thereby formed in the active region 12.

The optoelectronic semiconductor chip 100 is penetrated by dislocations, for example so-called threading dislocations 3. These occur in a high density particularly during the heteroepitaxy of the nitride compound semiconductor material on sapphire. The threading dislocations 3 in this case constitute potential paths for an ESD voltage pulse 4, the electrical charge of which is dissipated in the reverse direction of the pn junction. A problem in this case is that the charge flows away through the weakest or a few weak leakage paths which are formed along one or a few of the threading dislocations 3.

Figure 1B:
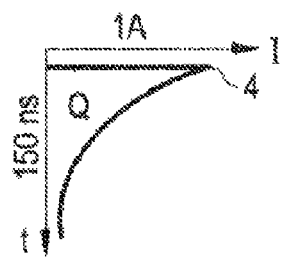

FIG. 1B shows the current (I)/time (t) characteristic of a conventional ESD voltage pulse 4.

Figure 1C:
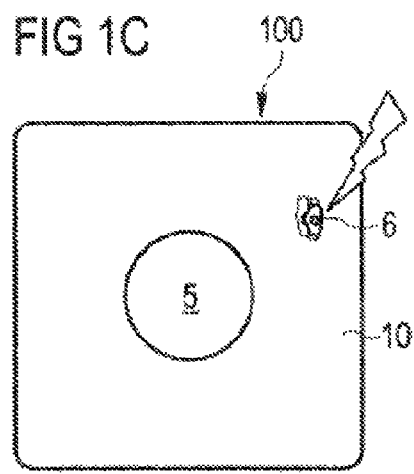

The flow of the charge of an ESD voltage pulse 4 away through one or a few threading dislocations 3 leads to destruction 6 of the optoelectronic semiconductor chip 100, as represented in FIG. 1C.

FIG. 1C shows a plan view of the radiation transmission surface 10 of an optoelectronic semiconductor chip 100, wherein an electrical contact 5 is arranged on the radiation transmission surface 10.

The optoelectronic semiconductor chip described here is now based, inter alia, on the idea of encapsulating the leakage current paths formed by the threading dislocations 3 by means of microdiodes 11 in an ESD layer introduced separately therefor. The basis of the microdiodes 11 is formed by the V-pits, which are generated by means of particular growth conditions and are preferably formed precisely on the lines of the threading dislocations 3. This means that V-pits, which form microdiodes 11, are deliberately formed on the potential current paths. Preferably at least 75%, particularly preferably all of the threading dislocations 3 comprise a microdiode 11. This is represented in a schematic sectional representation of the optoelectronic semiconductor chip 100, in FIG. 2.

The V-pits, which form microdiodes 11, preferably have similar dimensions. This means that a majority of the V-pits have a similar base area, for example at the interface between the ESD layer 9 and the active layer 12. A similar base area is, for example, characterized in that it lies within a range of ±25%, in particular ±10%, around an average value of the base area of all the V-pits on the interface. The V-pits having similar dimensions form microdiodes 11 which have electrical properties of the same type, in particular a breakdown behavior of the same type.

The optoelectronic semiconductor chip 100 comprises a substrate 7, which for example contains sapphire or consists of sapphire. The first semiconductor layer sequence 1 and the second semiconductor layer sequence 2 are subsequently deposited onto the substrate 7.

Figure 3A:
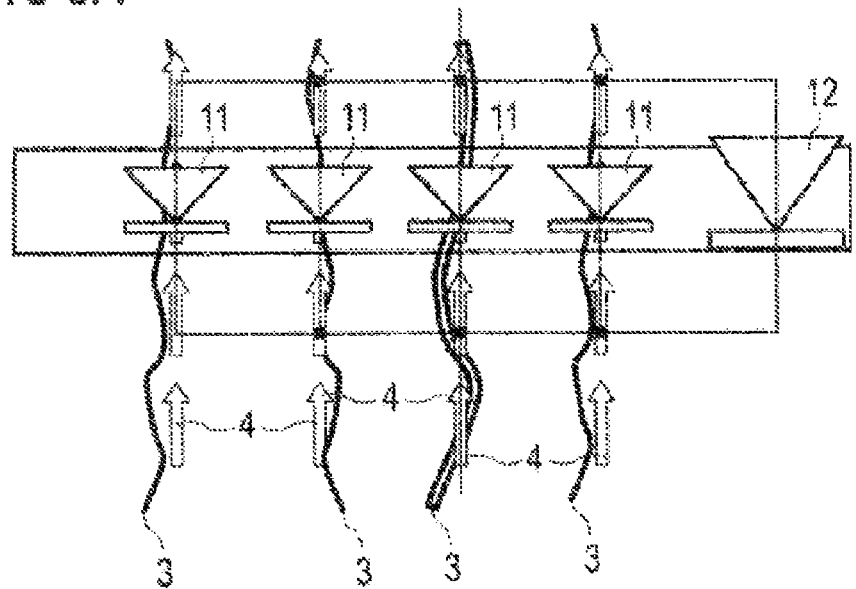

In contrast to the optoelectronic semiconductor chip 100 described in connection with FIG. 1A, the first semiconductor layer sequence 1 now comprises the ESD layer 9, which contains V-pits that form the microdiodes 11. FIG. 3A shows a schematic circuit diagram for the optoelectronic semiconductor chip 100 of FIG. 2.

The microdiodes 11 have a breakdown behavior of the same type, i.e., they have the same or essentially the same breakdown voltage. The breakdown voltage of the microdiodes 11 is in this case less than the breakdown voltage of the pn junction which is formed by the active region. The microdiodes 11 therefore open simultaneously in the event of an ESD voltage pulse 4 (cf. FIG. 3B) in the reverse direction. The charge imparted by the ESD voltage pulse 4 does not therefore flow away through the weakest leakage paths or paths along the dislocations lines 3, as shown in FIG. 1A, but instead the charge is distributed over the ensemble of microdiodes 11. Therefore, a critical current density which leads to destruction 6 of the optoelectronic semiconductor chip 100 is not reached on any of the paths. A quasi two-dimensional breakdown takes place over the entire cross-sectional area of the optoelectronic semiconductor chip 100, and therefore an ESD strength of at least 1 kV, for example typically 2 kV, can be achieved. This means that the weakest leakage current paths in the optoelectronic semiconductor chip are protected by means of the microdiodes, and the load due to an ESD voltage pulse is distributed over all the microdiodes 11, or at least a majority of the microdiodes 11, so that the current densities which occur are respectively so small that no damage takes place.

Figure 3B:
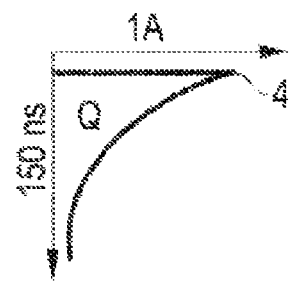
Figure 3C:
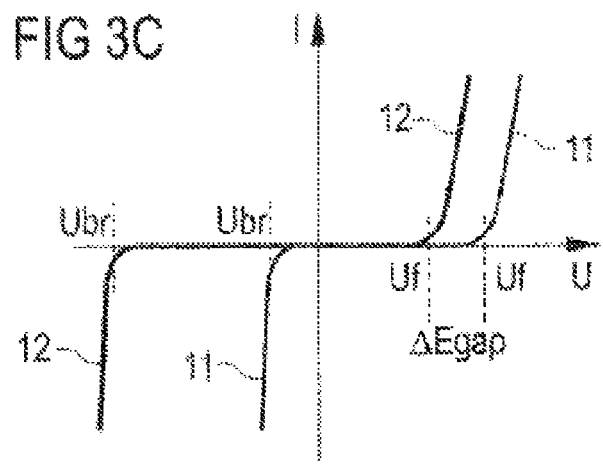

FIG. 3C here schematically shows the current (I)/voltage (U) characteristic of the microdiodes 11 and of the active region 12. The breakdown voltage UBR of the microdiodes 11 is less than the breakdown voltage of the active region 12. The threshold voltage UF of the active region 12, on the other hand, is less than the threshold voltage of the microdiodes 11, and so the forward characteristic of the optoelectronic semiconductor chip 100 is not perturbed or is only slightly perturbed by the microdiodes 11.

Figure 4A:
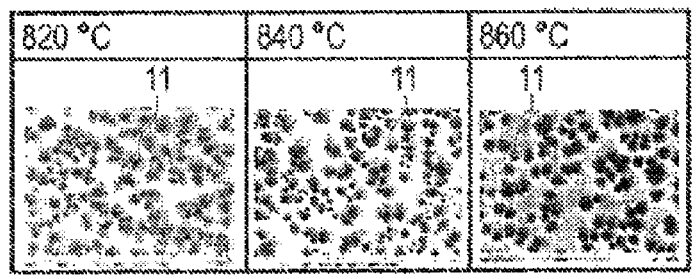
Figure 4B:
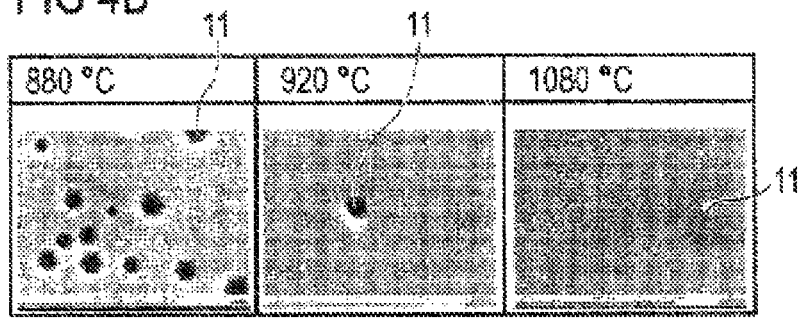

The growth conditions, under which the ESD layer 9 comprising the microdiodes 11 can be generated, will be described in more detail in connection with FIGS. 4A to 4C. FIG. 4A shows images of the optoelectronic semiconductor chip, the ESD layers 9 having been grown at different temperatures of between 820° C. and 860° C. FIG. 4B shows images of ESD layers 9 which have grown at temperatures of between 880° C. and 1080° C.

Figure 4C:
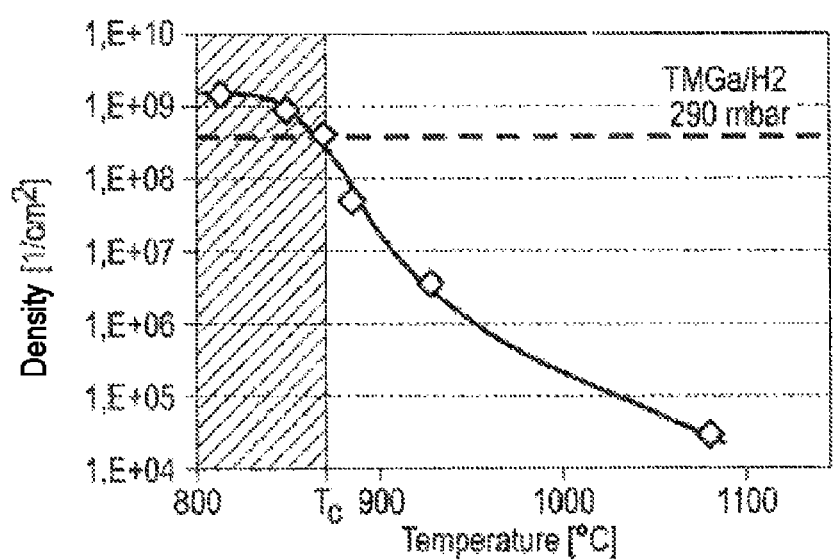

FIG. 4C shows a graphical plot of the density of the V-pits as a function of the growth temperature. As can be seen from FIGS. 4A to 4C, the density of the V-pits depends strongly on the growth temperature T. The ESD layer 9 consists, for example, of gallium nitride. A sufficient density of V-pits, and therefore of microdiodes 11 for protecting the optoelectronic semiconductor chip 100, is achieved in the present case below the critical temperature $T_C$ of about 870°. This temperature may depend on the growth system used and/or the position at which the temperature is measured in the system. The critical temperature, below which the density of the V-pits is sufficiently high, may however be determined as shown in FIGS. 4A to 4C.

While the density of the microdiodes 11 can be adjusted by means of the growth temperature T, the size of the V-pits is also important for achieving a sufficient ESD strength of the optoelectronic semiconductor chip 100.

Figure 5:
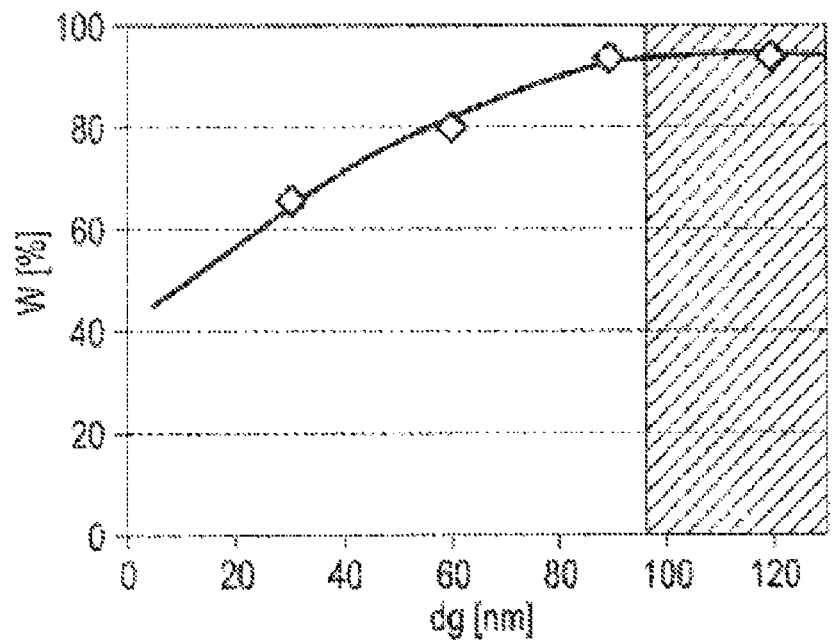

The graphical plot in FIG. 5 shows the thickness dg of the ESD layer 9 (in this regard, cf. also FIG. 2) plotted against the probability W that an optoelectronic semiconductor chip 100 will survive an ESD voltage pulse 4, as shown for example in FIG. 3B, without damage. As can be seen from FIG. 5, a thickness of the ESD layer 9 of at least 80 nm, preferably at least 100 nm, proves particularly suitable in the present case.

As described above, the suitable thickness depends on the thickness of the active region.

Figure 6:
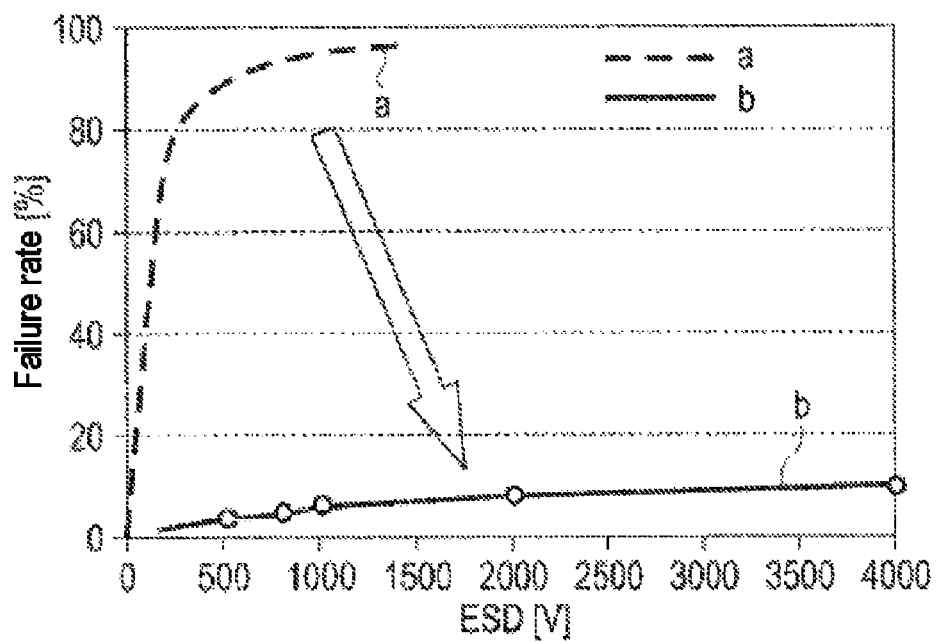

The graphical plot of FIG. 6 shows the failure rate of the optoelectronic semiconductor chips 100 for conventional semiconductor chips a and optoelectronic semiconductor chips b as described here, plotted against the ESD voltage in volts.

As can be seen from FIG. 6, the failure rate in the event of ESD voltage pulses 4 decreases greatly.

It has in this case been found that the ESD protection is especially advantageous in particular for light-emitting diode chips that emit green light or laser diode chips that emit green light, since—owing to the high indium content of the active zone—they are particularly susceptible to ESD without the microdiodes 11.

Figure 7A:
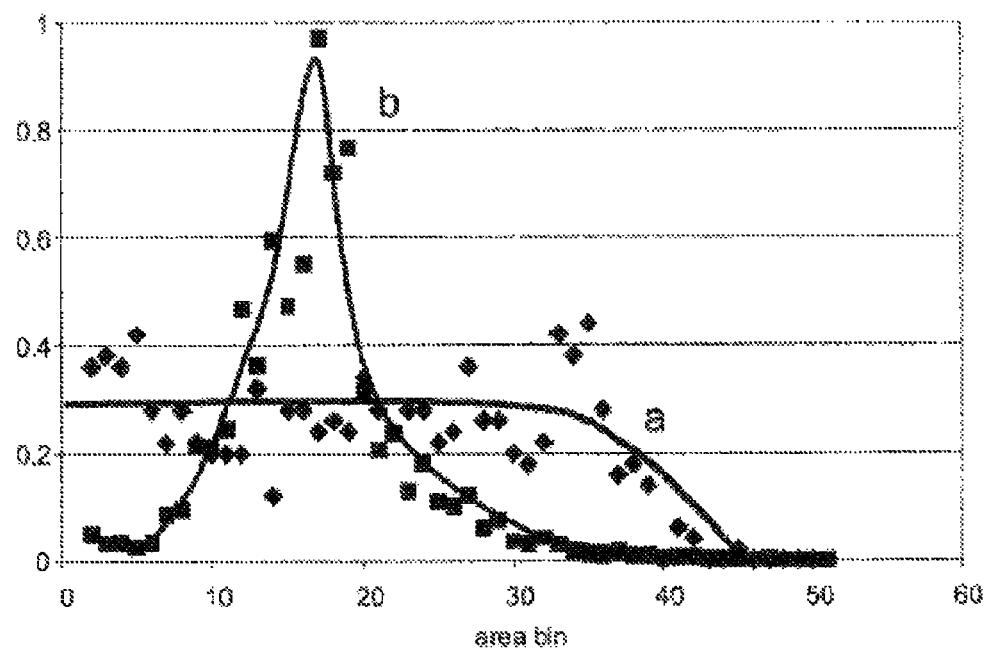
Figure 7B:
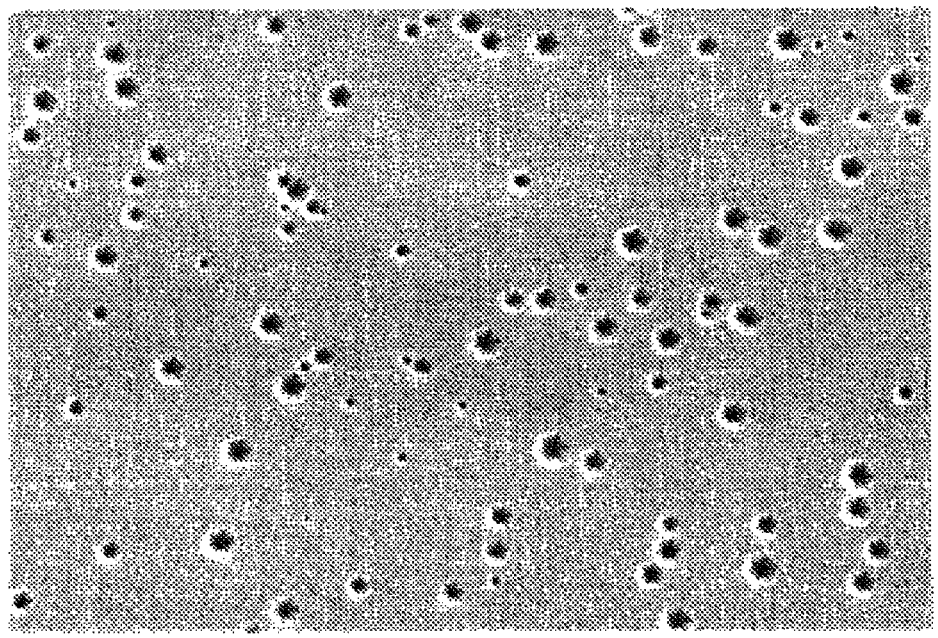

FIG. 7A shows a graphical plot of the base areas of V-pits for a first growth mode (curve a) and a second growth mode (curve b). The base areas are in this case sorted into so-called "area bins" (i.e., classes of equal or similar base area); the number of respective V-pits in the associated class is indicated relative to the total number. As can be seen from FIG. 7A, curve a for the first growth mode has a wide distribution of the dimensions of the V-pits. These V-pits were grown using a trimethylgallium precursor with the carrier gas hydrogen. FIG. 7B shows a corresponding image of the base areas of V-pits in a plane perpendicular to the growth direction.

Figure 7C:
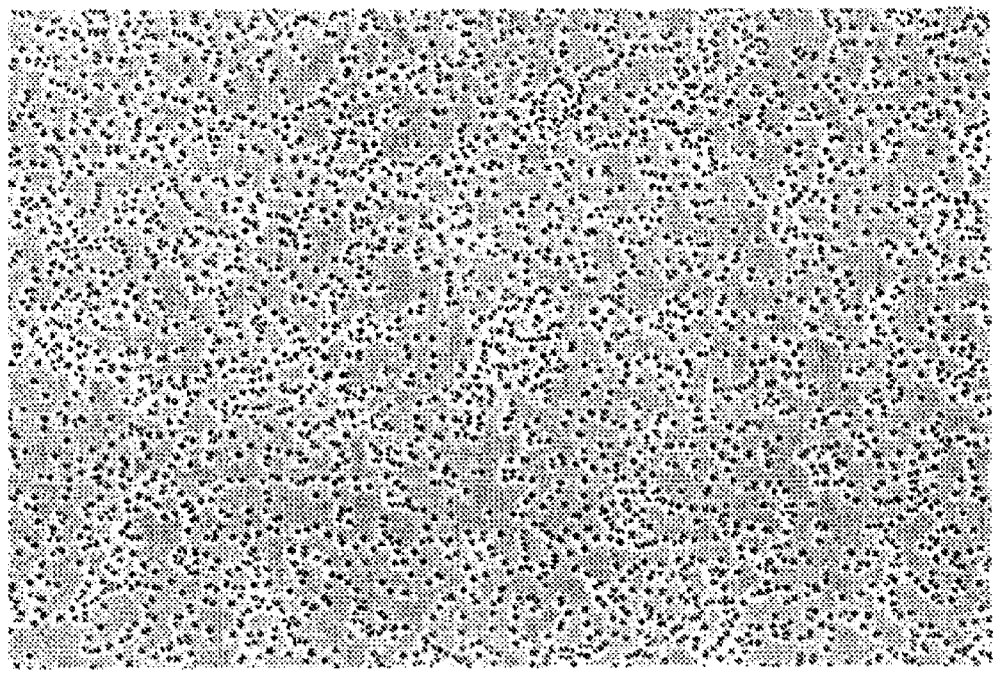

Conversely, curve b shows a pronounced maximum, i.e. a majority of the V-pits have a similar or equal base area. These V-pits were grown using a triethylgallium precursor with the carrier gas nitrogen at a growth temperature below 900° C. FIG. 7C shows a corresponding image of the V-pits in a plane perpendicular to the growth direction. These V-pits form microdiodes having electrical properties of the same type, which are particularly suitable for ESD protection of the optoelectronic semiconductor chip.

The description with the aid of the exemplary embodiments does not restrict the invention to said exemplary embodiments. Rather, the invention encompasses any new feature and any combination of features, which may in particular comprise any combination of features in the patent claims, even if this feature or this combination is not itself indicated explicitly in the patent claims or exemplary embodiments.

The invention claimed is:

1. A method of fabricating an optoelectronic semiconductor chip, the method comprising:
   epitaxially depositing a first semiconductor layer sequence over a growth substrate, the first semiconductor layer sequence comprising an ESD layer, wherein the first semiconductor layer sequence is deposited at a growth temperature at which V-pits occur in a high density in the ESD layer, wherein the ESD layer is based on GaN, and wherein the ESD layer is grown at a growth temperature below 900° C. by using triethylgallium precursor with a nitrogen carrier gas; and
   epitaxially depositing a second semiconductor layer sequence onto the first semiconductor layer sequence, the second semiconductor layer sequence comprising an active region.

2. The method according to claim 1, wherein the growth substrate comprises sapphire.

3. The method according to claim 1, wherein the method is used to fabricate an optoelectronic semiconductor chip comprising:
   the first semiconductor layer sequence comprising a plurality of microdiodes; and
   the second semiconductor layer sequence comprising the active region,
   wherein the first semiconductor layer sequence and the second semiconductor layer sequence are based on a nitride compound semiconductor material,
   wherein the microdiodes form an ESD protection for the active region, and
   wherein a majority of the microdiodes have a breakdown behavior of the same type.

4. The method according to claim 1, wherein the V-pits are formed on dislocation lines in a clearly defined ESD layer.

5. A method for fabricating an optoelectronic semiconductor chip, the method comprising:
   epitaxially depositing a first semiconductor layer sequence over a growth substrate; and
   epitaxially depositing a second semiconductor layer sequence onto the first semiconductor layer sequence,
   wherein the first semiconductor layer sequence comprises an ESD layer that is deposited at a growth temperature at which V-pits occur in a high density in the ESD layer,
   wherein the second semiconductor layer sequence comprises an active region,
   wherein the ESD layer is based on GaN, the ESD layer being grown at a growth temperature between 790° C. and 870° C. inclusive by using a triethylgallium precursor with a nitrogen carrier gas, and
   wherein the majority of the V-pits have similar dimensions.

6. A method for fabricating an optoelectronic semiconductor chip, the method comprising:
   epitaxially depositing a first semiconductor layer sequence over a growth substrate; and
   epitaxially depositing a second semiconductor layer sequence onto the first semiconductor layer sequence,
   wherein the first semiconductor layer sequence comprises an ESD layer that is deposited at a growth temperature at which V-pits occur in a high density in the ESD layer,
   wherein the second semiconductor layer sequence comprises an active region, wherein the ESD layer is based on GaN, the ESD layer being grown at a growth temperature of at least 790° by using a triethylgallium precursor with a nitrogen carrier gas, and wherein the density of the V-pits is at least $5\times10^8/cm^2$.

7. The method according to claim 1, wherein the density of the V-pits is at least $5\times10^8/cm^2$.

8. The method according to claim 1, wherein the density of the V-pits is at most $5\times10^9/cm^2$.

9. The method according to claim 1, wherein a growth time of the ESD layer is chosen such that the ESD layer has a thickness that is between half and three times a thickness of the active region.

10. The method according to claim 4, wherein the ESD layer has a thickness of at least 80 nm and at most 150 nm.

11. The method according to claim 1, wherein at least 75% of the V-pits have similar dimensions.

* * * * *